US009487391B2

(12) United States Patent
Cheng et al.

(10) Patent No.: US 9,487,391 B2
(45) Date of Patent: Nov. 8, 2016

(54) MICRO-ELECTRO MECHANICAL SYSTEM (MEMS) DEVICE HAVING A BLOCKING LAYER FORMED BETWEEN CLOSED CHAMBER AND A DIELECTRIC LAYER OF A CMOS SUBSTRATE

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW)

(73) Assignee: Taiwan Semiconductor Manufacturing Co., Ltd., Hsinchu (JP)

( * ) Notice: Subject to any disclaimer, the term of this patent is extended or adjusted under 35 U.S.C. 154(b) by 5 days.

(21) Appl. No.: 14/084,161

(22) Filed: Nov. 19, 2013

(65) Prior Publication Data
US 2015/0137276 A1    May 21, 2015

(51) Int. Cl.
 *B81B 7/02* (2006.01)
 *B81C 1/00* (2006.01)
(52) U.S. Cl.
 CPC ............. *B81C 1/00293* (2013.01); *B81B 7/02* (2013.01); *B81C 1/00238* (2013.01)
(58) Field of Classification Search
 CPC ....... H01L 21/02; H01L 29/84; H01L 24/29; H01L 23/3171; H01L 28/60; B81B 7/02; B81B 7/0038; B81C 1/00293; B81C 1/00182; B81C 1/00238
 See application file for complete search history.

(56) References Cited

U.S. PATENT DOCUMENTS

| 7,659,150 B1* | 2/2010 | Monadgemi et al. ......... 438/125 |
| 8,350,346 B1* | 1/2013 | Huang et al. ................. 257/415 |
| 2007/0284682 A1 | 12/2007 | Laming et al. |
| 2009/0134459 A1* | 5/2009 | Goto ................... B81C 1/00246 257/347 |
| 2009/0294879 A1 | 12/2009 | Bhagavat et al. |
| 2012/0142144 A1 | 6/2012 | Taheri |
| 2012/0326248 A1* | 12/2012 | Daneman et al. ............ 257/415 |
| 2013/0193527 A1 | 8/2013 | Chu et al. |
| 2013/0283912 A1* | 10/2013 | Lin ..................... G01P 15/0802 73/514.16 |
| 2013/0334621 A1 | 12/2013 | Classen et al. |
| 2014/0015069 A1* | 1/2014 | Liang et al. .................. 257/415 |
| 2014/0151820 A1 | 6/2014 | Howe et al. |
| 2014/0225206 A1* | 8/2014 | Lin et al. ...................... 257/417 |
| 2014/0227816 A1* | 8/2014 | Zhang et al. .................. 438/48 |
| 2015/0061046 A1* | 3/2015 | Chang et al. ................. 257/415 |
| 2015/0091153 A1* | 4/2015 | Liu et al. ...................... 257/704 |
| 2015/0097215 A1* | 4/2015 | Chu et al. ..................... 257/254 |
| 2015/0097253 A1* | 4/2015 | Tsau et al. .................... 257/415 |
| 2015/0329351 A1 | 11/2015 | Cheng et al. |

* cited by examiner

*Primary Examiner* — Fazli Erdem
(74) *Attorney, Agent, or Firm* — Birch, Stewart, Kolasch & Birch, LLP

(57) ABSTRACT

Embodiments of mechanisms for forming a micro-electro mechanical system (MEMS) device are provided. The MEMS device includes a CMOS substrate, a cap substrate, and a MEMS substrate bonded between the CMOS substrate and the cap substrate. The MEMS substrate includes a first movable element and a second movable element. The MEMS device also includes a first closed chamber and a second closed chamber, which are between the MEMS substrate and the cap substrate. The first movable element is in the first closed chamber, and the second movable element is in the second closed chamber. A first pressure of the first closed chamber is higher than a second pressure of the second closed chamber.

20 Claims, 20 Drawing Sheets

MICRO-ELECTRO MECHANICAL SYSTEM (MEMS) DEVICE HAVING A BLOCKING LAYER FORMED BETWEEN CLOSED CHAMBER AND A DIELECTRIC LAYER OF A CMOS SUBSTRATE

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have recently been developed. MEMS devices include devices fabricated using semiconductor technology to form mechanical and electrical features. The MEMS devices may include a number of elements (e.g., movable elements) for achieving mechanical functionality.

MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches or the like.

BRIEF DESCRIPTION OF THE DRAWINGS

For a more complete understanding of the illustrative embodiments, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained with reference to the accompanying drawings. Some variations of the embodiments are described.

Figure 1:
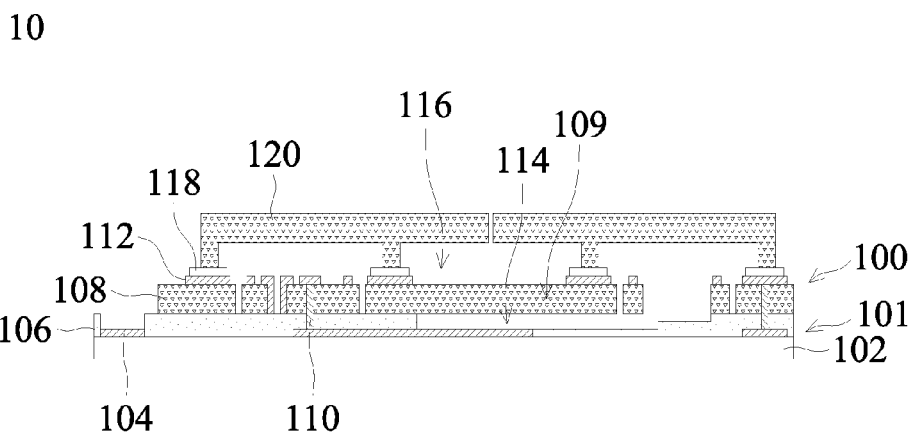
FIG. 1 is a cross-sectional view of a MEMS device, in accordance with some embodiments.

FIG. 1 is a cross-sectional view of a MEMS device 10, in accordance with some embodiments. The MEMS device 10 includes a MEMS substrate 100, a CMOS substrate 101, and a cap substrate 120. As shown in FIG. 1, the MEMS substrate 100 is sandwiched between the CMOS substrate 101 and the cap substrate 120.

Suitable bonding techniques may be used to bond the MEMS substrate 100, the CMOS substrate 101, and the cap substrate 120 together. The suitable bonding techniques may include fusion bonding, eutectic bonding, plasma activated bonding, thermocompression bonding, diffusion bonding, anodic bonding, other applicable bonding, or combinations thereof. Multiple cavities, including cavities 116 and 114, are formed. The cavity 116 is formed between the MEMS substrate 100 and the cap substrate 120, and the cavity 114 is formed between the MEMS substrate 100 and the CMOS substrate 101.

The CMOS substrate 101 includes a semiconductor substrate 102. The semiconductor substrate 102 may be made of silicon. Alternatively, the semiconductor substrate 102 may be made of other semiconductor materials, such as silicon germanium (SiGe), silicon carbide, other suitable semiconductor materials, or combinations thereof. Other substrates may also be used. For example, the semiconductor substrate 102 may include a multi-layered substrate, gradient substrate, hybrid orientation substrate, or combinations thereof. A wide variety of device elements, such as CMOS transistors, may be formed in/on the semiconductor substrate 102.

An interconnect structure is formed over the semiconductor substrate 102, as shown in FIG. 1. The interconnect structure includes a dielectric layer 106, which include multiple dielectric layers, and metal layers, which includes conductive pads 104. The conductive pads 104 may be electrically connected to the device elements formed in/on the semiconductor substrate 102, respectively. The conductive pad 104 may be used to provide electrical connections between the device elements and elements of the MEMS substrate 100.

As shown in FIG. 1, the MEMS substrate 100 is bonded with the CMOS substrate 101 and the cap substrate 120. The MEMS substrate 100 includes a semiconductor layer 108. The semiconductor layer 108 may be made of silicon or other applicable materials. The semiconductor layer 108 is patterned to have a variety of elements including a sensing element 109. The sensing element 109 is a movable element which is capable of bending, vibrating, deforming, or the like.

A conductive layer 112 may be formed over semiconductor layer 108. A conductive plug 110 may be formed between the conductive layer 112 and the conductive pad 104. Therefore, electrical connections between the elements of the MEMS substrate 100 and the device elements of the CMOS substrate 101 are established. The conductive layer 112 may also be used to bond with the cap substrate 120 through a bonding layer 118. The bonding layer 118 may be made of a semiconductor material, metal material, dielectric material, polymer material, other applicable materials, or combinations thereof.

In some embodiments, the sensing element 109 is a pliable diaphragm. The diaphragm is configured to measure a pressure within an adjacent cavity, such as the cavity 116, based upon capacitance changes caused by a force that the pressure exerts on the diaphragm. For example, a high pressure existent within the cavity 116 could cause the diaphragm to bend towards the cavity 114 more than a low pressure. As shown in FIG. 1, the cavity 114 may be a closed chamber with a high vacuum. Therefore, the diaphragm could bend towards the cavity 114 more easily. The sensitivity of the pressure sensor depends on the degree of vacuum of the cavity 114.

In some embodiments, however, the degree of vacuum of the cavity 114 may be gradually decreased due to the gas coming from dielectric materials surrounding the cavity 114. For example, impurity gas may come from the dielectric layer 106 to reduce the degree of vacuum of the cavity 114. As a result, the bending of the sensing element 109 is negatively influenced such that the sensitivity of the pressure sensor is reduced.

As shown in FIG. 1, the pressure or the degree of vacuum of the cavity 114 is determined when the cap substrate 120 is bonded with the MEMS substrate 100. The pressure of the cavity 114 is substantially the same as the pressure of a process chamber used for bonding the cap substrate 120 and the MEMS substrate 100 together. Therefore, the cavities formed have only one kind of pressure which is substantially the same as that of the process chamber. However, in some other embodiments, there is a need to form two or more cavities (or closed chambers) having different pressures.

Figure 2A:
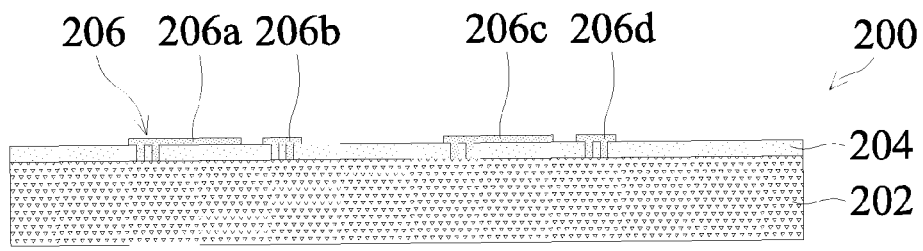
FIGS. 2A-2Q are cross-sectional views of various stages of a process for forming a MEMS device, in accordance with some embodiments.

Therefore, it is desirable to find alternative mechanisms for forming a MEMS device to reduce or resolve the problems mentioned above. FIGS. 2A-2Q are cross-sectional views of various stages of a process for forming a MEMS device, in accordance with some embodiments.

As shown in FIG. 2A, a MEMS substrate 200 (or a MEMS wafer) is provided, in accordance with some embodiments. The MEMS substrate 200 includes a semiconductor substrate 202. The semiconductor substrate 202 includes a bulk semiconductor substrate such as a silicon wafer. The bulk semiconductor substrate may be made of silicon, germanium, silicon carbide, or the like. Alternatively, other substrates that may be used include multi-layered substrates, gradient substrates, hybrid orientation substrates, and/or the like. In some other embodiments, the semiconductor substrate 202 includes a semiconductor on insulator (SOI) substrate.

As shown in FIG. 2A, a dielectric layer 204, such as a silicon oxide layer or other suitable materials, is deposited over the semiconductor substrate 202. The dielectric layer 204 may be deposited by using a chemical vapor deposition (CVD) process, spin-on process, or other applicable processes. Afterwards, the dielectric layer 204 is patterned to form one or more contact holes in the dielectric layer 204. The contact holes expose the semiconductor substrate 202 underlying the dielectric layer 204.

As shown in FIG. 2A, a conductive layer 206 is deposited and patterned over the dielectric layer 204, in accordance with some embodiments. The conductive layer 206 is made of a conductive material having a high melting point, such as higher than about 900 degrees C. In some embodiments, the conductive layer 206 has a melting point higher than about 1200 degrees C. In some embodiments, the conductive layer 206 is made of a semiconductor material, such as polysilicon. The conductive layer 206 may be deposited by using a CVD process, physical vapor deposition (PVD) process, or other applicable processes. The conductive layer 206 may be doped with n-type impurities or p-type impurities to have a suitable conductivity.

The conductive layer 206 is patterned into multiple portions including portions 206a, 206b, 206c, and 206d, in accordance with some embodiments. Each of these portions may function as a contact element and/or an electrode element. Some of these portions may be electrically connected with each other.

Figure 2B:
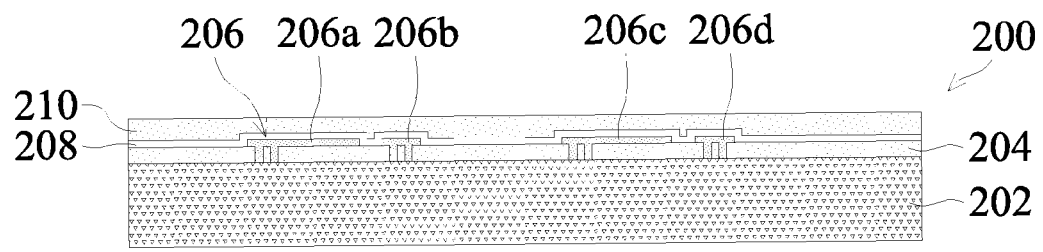

As shown in FIG. 2B, an etch stop layer 208 is deposited over the dielectric layer 204 and the conductive layer 206, in accordance with some embodiments. The etch stop layer 208 may be conformally deposited over the dielectric layer 204 and the conductive layer 206. The etch stop layer 208 may be made of silicon nitride, aluminum oxide, silicon carbide, other applicable materials, or combinations thereof. In some embodiments, the etch stop layer 208 is a low stress silicon nitride layer, which can also function as a blocking layer to prevent gas from penetrating through the etch stop layer 208. The etch stop layer 208 may be deposited by using a CVD process (such as a LPCVD process), spin-on process, or other applicable processes. The stress of the low stress silicon nitride layer may be in a range from about −50 MPa to about 50 MPa.

Afterwards, a dielectric layer 210 is deposited over the etch stop layer 208, as shown in FIG. 2B. The dielectric layer 210 may be made of silicon oxide or other suitable materials. A CVD process or the like may be performed to deposit the dielectric layer 210. A planarization process, such as a chemical mechanical polishing (CMP) process, may be performed on the dielectric layer 210.

Figure 2C:
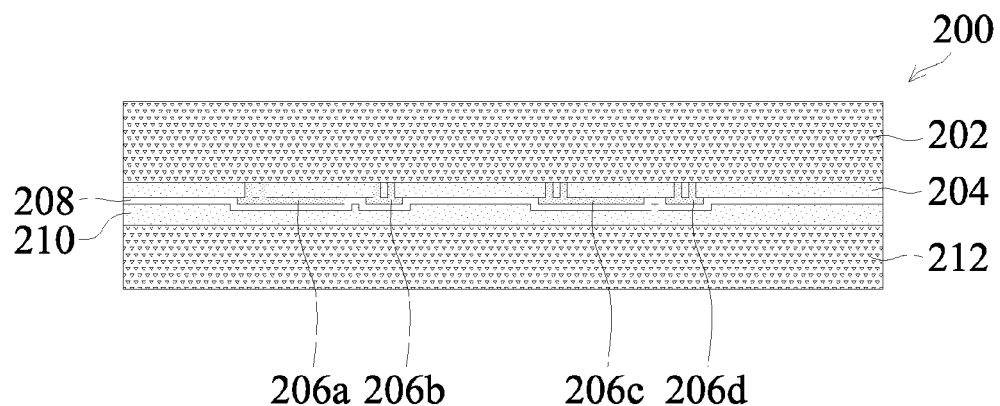

As shown in FIG. 2C, the MEMS substrate 200 is flipped upside down and bonded with a carrier substrate 212 (or a carrier wafer), in accordance with some embodiments. In subsequent operations, the carrier substrate 212 is thinned to be a blocking layer which is configured to block gas from penetrating through. Therefore, the carrier substrate 212 is made of a material capable of blocking gas. For example, the carrier substrate 212 may be made of a semiconductor material, metal material, dielectric material, other applicable materials, or combinations thereof. In some embodiments, the carrier substrate 212 is a semiconductor carrier wafer, such as a silicon wafer.

The MEMS substrate 200 may be bonded with the carrier substrate 212 through the dielectric layer 210. The carrier substrate 212 is in direct contact with the dielectric layer 210. The bonding between the carrier substrate 212 and the dielectric layer 210 may be achieved by using fusion bonding, eutectic bonding, plasma activated bonding, thermocompression bonding, diffusion bonding, anodic bonding, other applicable bonding, or combinations thereof. In some embodiments, the MEMS substrate 200 is disposed over the carrier substrate 212 such that the carrier substrate 212 and the dielectric layer 210 are bonded together. Afterwards, an annealing process may be performed to enhance the bonding between the carrier substrate 212 and the dielectric layer 210. For example, the bonded carrier substrate 212 and the dielectric layer 210 are annealed at a temperature of about 300 degrees C. Other temperatures and/or pressures may also be applied during the bonding process.

Figure 2D:
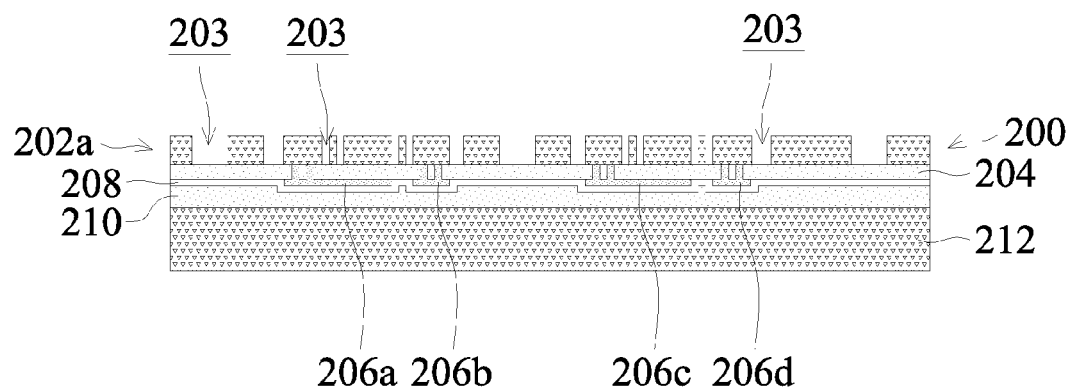

As shown in FIG. 2D, the semiconductor substrate 202 is thinned and patterned into a number of elements 202a, in accordance with some embodiments. The semiconductor substrate 202 may be thinned by using a mechanical grinding process, CMP process, etching process, other applicable processes, or combinations thereof. Afterwards, a portion of the thinned semiconductor substrate 202 is removed to form openings 203 which expose the dielectric layer 204. As a result, the thinned semiconductor substrate 202 is patterned to be the elements 202a. Some of the elements 202a connect with each other, and some of the elements do not connect with each other.

Figure 2E:
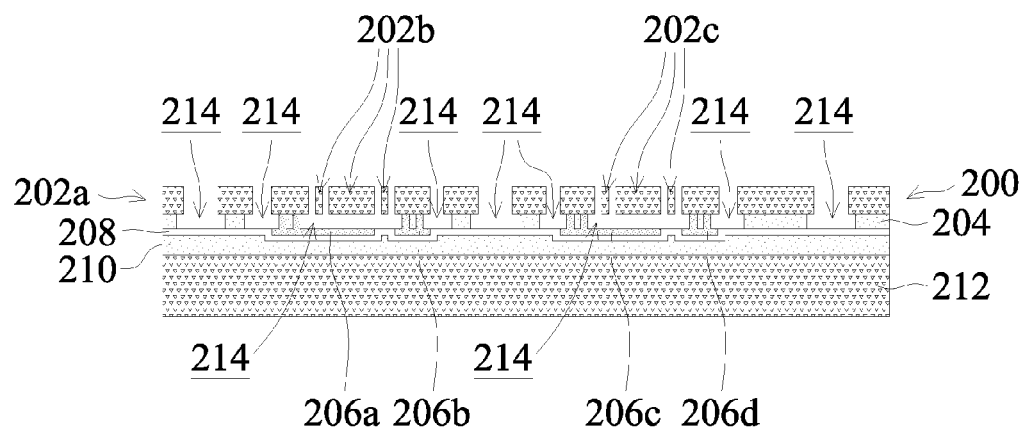

As shown in FIG. 2E, a portion of the dielectric layer 204 is removed through the openings 203 to form a number of cavities 214, in accordance with some embodiments. An etching process is performed to partially remove the dielectric layer 204. For example, a vapor HF is used as the etchant to remove the dielectric layer 204. Therefore, the cavities 214 are formed. The etch stop layer 208 prevents the dielectric layer 210 under the cavities 214 from being etched. After the cavities 214 are formed, a portion of the semiconductor substrate 202 is released from the dielectric layer 204 to form a number of elements 202a. Some or all of the elements 202a become movable elements which include movable elements 202b and 202c. The movable elements 202b and 202c are capable of bending, vibrating, deforming, or the like.

In some embodiments, the MEMS substrate 200 is annealed at a high temperature to induce the outgassing of the dielectric layers including the dielectric layers 204 and 210. Therefore, the dielectric layers contain less gas after being annealed. The degree of vacuum of a cavity or a closed chamber to be formed could be maintained more easily. For example, the MEMS substrate 200 is annealed at a temperature ranging from about 900 degrees C. to about 1200 degrees C. for about 2 hours. Different annealing times may also be used.

In some embodiments, the MEMS substrate 200 is annealed after the cavities 214 are formed. In some embodiments, the MEMS substrate 200 is annealed before the cavities 214 are formed. Since there is no metal line formed in the MEMS substrate 200, the annealing process could reduce the gas, coming from the dielectric layers 204 and 210, without destroying elements which have been formed in the MEMS substrate 200.

Figure 2F:
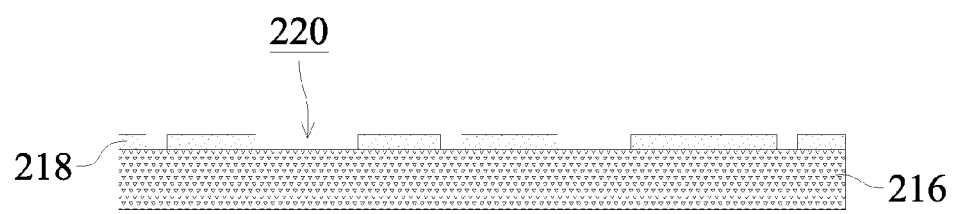

As shown in FIG. 2F, a cap substrate 216 (or cap wafer) and a patterned dielectric layer 218 formed over the cap substrate 216 are provided, in accordance with some embodiments. The cap substrate 216 may be made of a semiconductor material, such as silicon or the like. The dielectric layer 218 may be made of silicon oxide or other suitable materials. The dielectric layer 218 is patterned to have a number of openings 220 which expose the cap substrate 216.

In some embodiments, the cap substrate 216 and the dielectric layer 218 are annealed at a high temperature to induce the outgassing of the dielectric layer 218. Therefore, the dielectric layer 218 contains less gas after being annealed. The degree of vacuum of a cavity or a closed chamber to be formed could be maintained more easily. For example, the cap substrate 216 and the dielectric layer 218 are annealed at a temperature ranging from about 900 degrees C. to about 1200 degrees C. for about 2 hours. Different annealing times may also be used. In some embodiments, the dielectric layer 218 is made of a thermal oxide or the like. In these cases, the annealing process may not be needed.

Figure 2G:
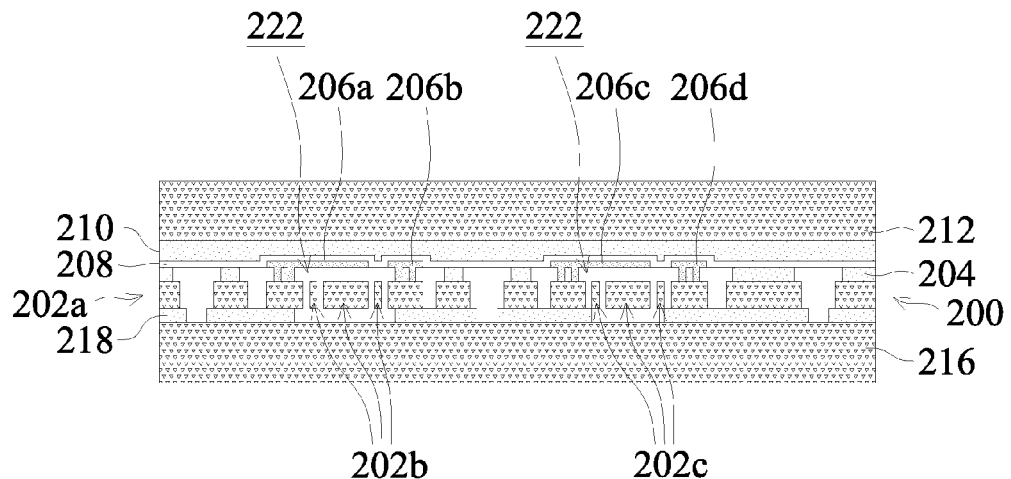

As shown in FIG. 2G, the structure shown in FIG. 2E is flipped upside down and bonded with the structure shown in FIG. 2F, in accordance with some embodiments. The elements 202a are bonded with the dielectric layer 218. The elements 202a may be in direct contact with the dielectric layer 218. The bonding between the elements 202a and the dielectric layer 218 may be achieved by using fusion bonding, eutectic bonding, plasma activated bonding, thermocompression bonding, diffusion bonding, anodic bonding, other applicable bonding, or combinations thereof.

As shown in FIG. 2G, a number of closed chambers 222 are formed between the cap substrate 216 and the carrier substrate 212 after the bonding between the elements 202a and the dielectric layer 218. Each of the closed chambers 222 is a combination of one of the cavities 214 and one of the openings 220. The elements 202a are surrounded by the closed chambers 222. Some of the closed chambers 222 are connected to each other. Some of the closed chambers 222 are isolated from each other. The bonding process may be performed in a process chamber, which has a predetermined pressure, of a bonding tool. As a result, the closed chambers 222 formed in the process chamber would also have substantially the same pressure. In some embodiments, the pressure of each of the closed chambers 222 is in a range from about 0.05 atm to about 3 atm. The pressure of the closed chambers 222 may be adjusted by tuning the pressure of the process chamber.

Figure 2H:
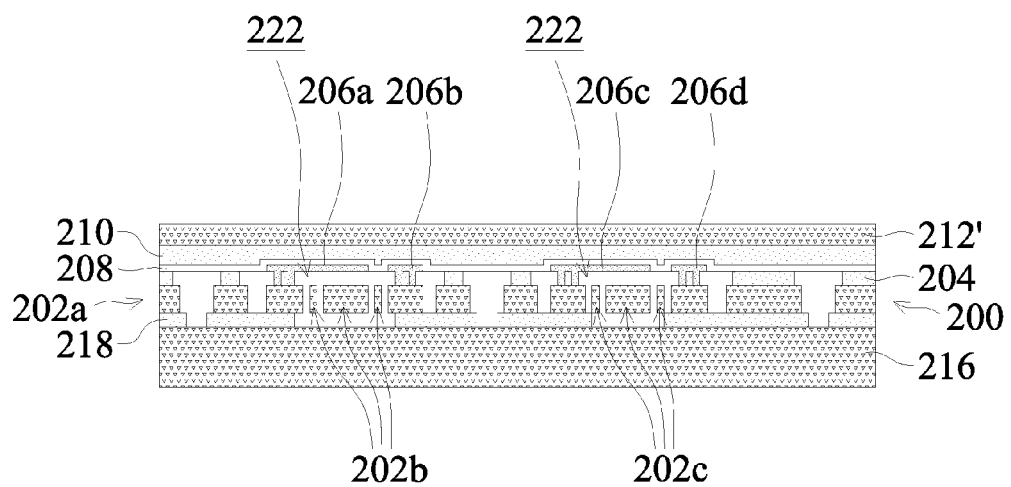

As shown in FIG. 2H, the carrier substrate 212 is thinned to be a blocking layer 212', in accordance with some embodiments. The blocking layer 212' is configured to block gas from penetrating through the blocking layer 212' to change the pressure of the closed chambers 222. The blocking layer 212' may have a thickness in a range from about 2 µm to about 10 µm. In some other embodiments, the carrier substrate 212 is not thinned. In these cases, the carrier substrate 212 can also function as a blocking layer.

Figure 2I:
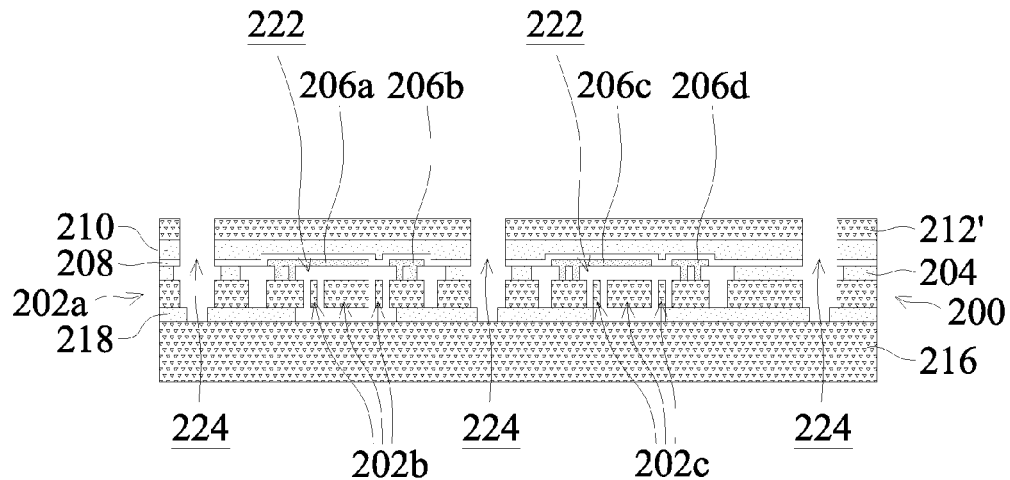

As shown in FIG. 2I, portions of the blocking layer 212', the dielectric layer 210, and the etch stop layer 208 are removed to form openings 224, in accordance with some embodiments. The openings 224 open some of the closed chambers 222 and expose the cap substrate 216. In some embodiments, a photolithography process and multiple etching processes are performed to form the openings 224. For example, a first etching process is performed to partially remove the blocking layer 212' to form through holes until the dielectric layer 210 is exposed. Afterwards, a second etching process is performed to partially remove the dielectric layer 210 and the etch stop layer 208. Both the dielectric layer 210 and the etch stop layer 208 may be etched in a single etching operation. For example, a suitable etchant, such as a mixture of $CF_4$ and $O_2$, may be used. As a result, the openings 224 are formed. Different etchants may be used in the first and second etching processes. An annealing process may then be performed at a temperature ranging from about 900 degrees C. to about 1200 degrees C. for about 2 hours. Different annealing times may also be used.

Figure 2J:
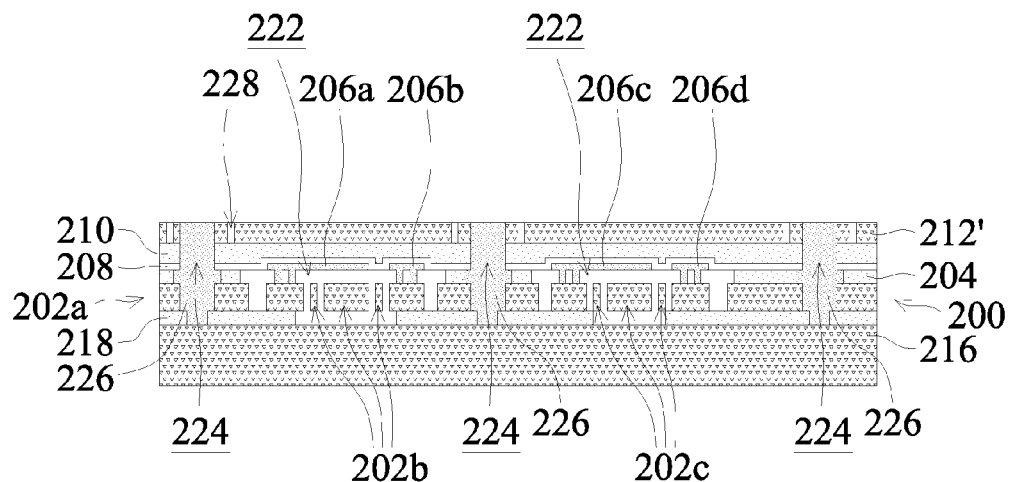

As shown in FIG. 2J, a second blocking layer 226 is deposited over the blocking layer 212' to fill the openings 224, in accordance with some embodiments. The second blocking layer 226 may be used to stop the gas coming from dielectric layers, such as those of a CMOS substrate (not shown in FIG. 2J) to be bonded with the MEMS substrate 200. The second blocking layer 226 may be made of a semiconductor material, metal material, or other applicable materials. For example, the second blocking layer 226 is made of polysilicon. The second blocking layer 226 may be deposited by using a CVD process (such as a LPCVD process), spin-on process, or other appropriate processes. A planarization process, such as a CMP process or the like, may be performed to remove the second blocking layer 226 outside of the openings 224.

If the blocking layer 212' and the second blocking layer 226 are electrically conductive, the blocking layer 212' may be patterned to form recesses 228 to separate the blocking layer 212' and the second blocking layer 226 into multiple isolated portions. Therefore, short circuiting is prevented. In some embodiments, each of the blocking layer 212' and the second blocking layer 226 also functions as an electrical shielding. Electromagnetic interference caused by neighboring elements, such as those of a CMOS substrate (not shown in FIG. 2J) to be bonded with the MEMS substrate 200, may be prevented by the blocking layer 212' and the second blocking layer 226.

In some embodiments, the materials of the second blocking layer 226 and the conductive layer 206 are substantially the same. For example, both the second blocking layer 226 and the conductive layer 206 are made of polysilicon. In some other embodiments, both the second blocking layer 226 and the conductive layer 206 are polysilicon layers with different doping concentrations. For example, the conductive layer 206 is a polysilicon layer with a higher doping concentration than the second blocking layer 226.

Figure 2K:
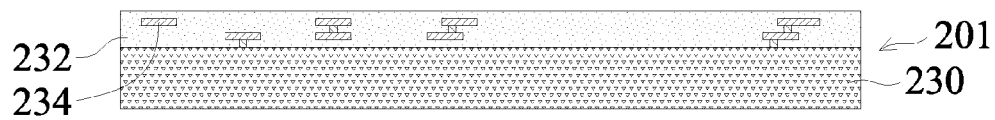

As shown in FIG. 2K, a CMOS substrate 201 (or a CMOS wafer) is provided, in accordance with some embodiments. The CMOS substrate 201 includes a semiconductor substrate 230 and a dielectric layer 232. The dielectric layer 232 includes multiple dielectric layers. Multiple conductive features (such as lines, vias, and contacts) are formed in the dielectric layer 232. The conductive features include conductive pads 234. Each of the conductive pads 234 is electrically connected to a region or a device element formed in/on the semiconductor substrate 230. In some embodiments, the dielectric layer 232 has a planarized top surface, which is, for example, a planarized oxide surface. The conductive pads 234 (or the top metal) may be buried under the planarized top surface.

Figure 2L:
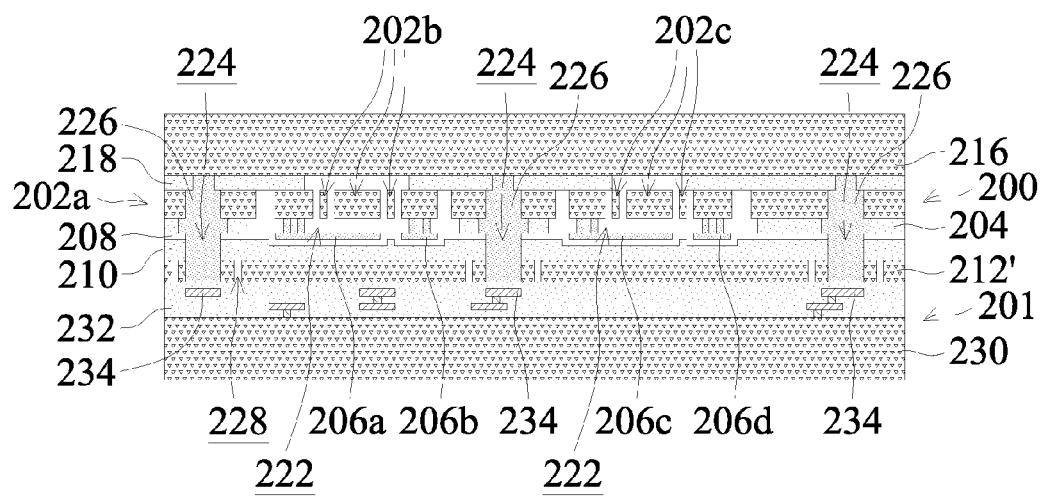

As shown in FIG. 2L, the MEMS substrate 200 and the CMOS substrate 201 are aligned and bonded with each other, in accordance with some embodiments. A fusion bonding process or other applicable processes may be performed to bond the planarized top surface of the dielectric layer 232 with the blocking layer 212' and the second blocking layer 226. In some embodiments, both the blocking layer 212' and the second blocking layer 226 are in direct contact with the dielectric layer 232. Some of the conductive pads 234 are substantially aligned with the second blocking layer 226 filling the openings 224.

Figure 2M:
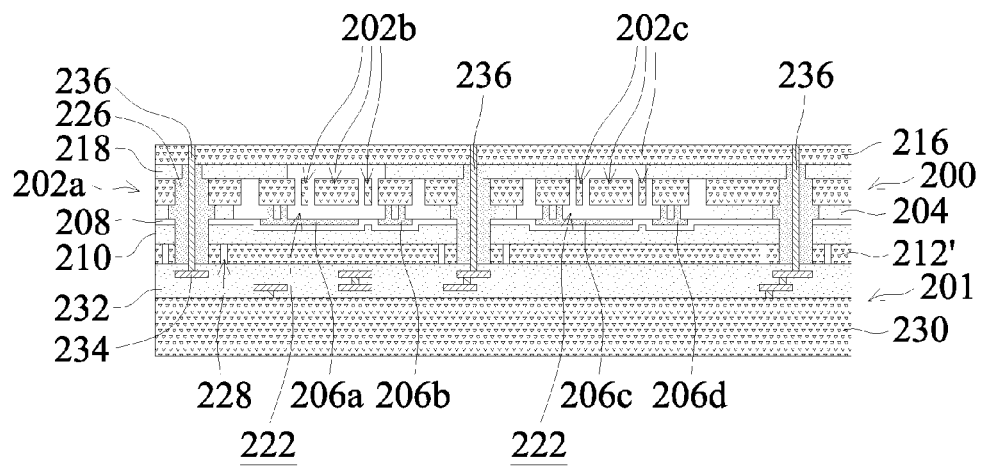

Afterwards, as shown in FIG. 2M, the cap substrate 216 is thinned, in accordance with some embodiments. The cap substrate 216 is thinned using a suitable process. The suitable process may include a mechanical grinding process, CMP process, etching process, other applicable processes, or combinations thereof.

As shown in FIG. 2M, conductive plugs 236 are formed to electrically and respectively connect to the conductive pads 234, in accordance with some embodiments. Each of the conductive plugs 236 penetrates through the cap substrate 216, the second blocking layer 226, and the dielectric layer 232 to electrically contact with the corresponding one of the conductive pads 234. In some embodiments, the conductive plugs 236 are in direct contact with the second blocking layer 226. Each of the conductive plugs 236 may have a single width.

In some embodiments, a photolithography process and multiple etching processes are performed to form a number of via openings. Each of the via openings exposes a corresponding one of the conductive pads 234. For example, a first etching process is performed to partially remove the cap substrate 216 and the second blocking layer 226 to form a through hole until the dielectric layer 232 is exposed. Afterwards, a second etching process is performed to partially remove the dielectric layer 232 such that the conductive pads 234 are exposed. As a result, the via openings are formed. Different etchants may be used in the first and second etching processes.

After the forming of the via openings, a conductive material may be deposited to fill the via openings to form the conductive plugs 236. In some embodiments, a planarization process, such as a CMP process, is performed to remove the conductive material outside of the via openings. The conductive material may be made of tungsten, copper, titanium, nickel, gold, other suitable materials, or combinations thereof. The conductive material may be deposited by using a CVD process, plating process, PVD process, other applicable processes, or combinations thereof.

Figure 2N:
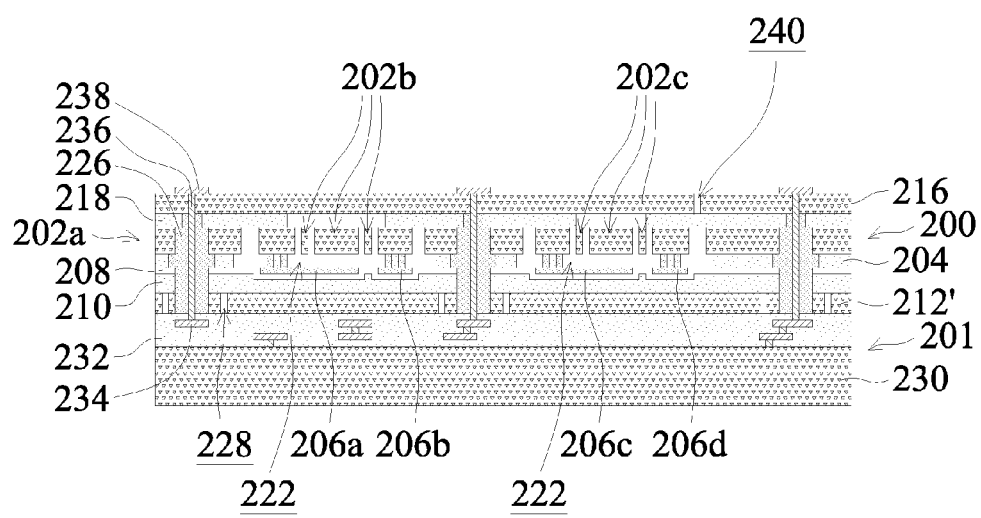

As shown in FIG. 2N, conductive pads 238 are formed over the cap substrate 216 to electrically contact with the conductive plugs 236, in accordance with some embodiments. The conductive pads 238 may be made of copper, aluminum, gold, other applicable materials, or combinations thereof. A metal layer may be deposited and patterned over the cap substrate 216 to form the conductive pads 238.

As shown in FIG. 2N, one or more release holes 240 are formed in the cap substrate 216 to expose the dielectric layer 218, in accordance with some embodiments. A photolithography process and an etching process may be performed to form the release hole(s) 240. In some embodiments, a single release hole 240 is formed in the cap substrate 216.

Figure 2O:
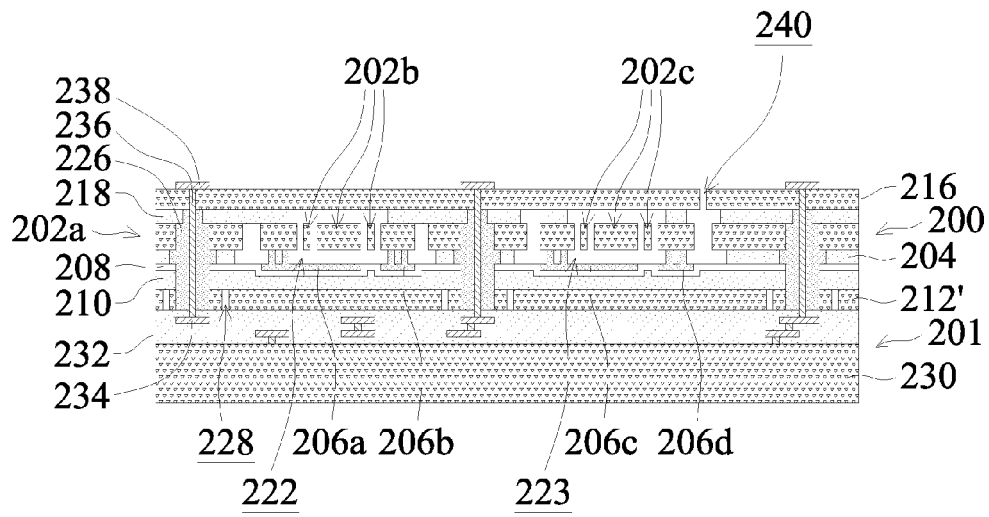

As shown in FIG. 2O, a portion of the dielectric layer 218 is removed through the release hole(s) 240 such that the closed chamber 222 is open to be a cavity 223, in accordance with some embodiments. An etching process is performed to form the cavity 223 surrounding the movable elements 202c. A portion of the dielectric layer 218 originally surrounding the closed chamber 222 is now removed such that the movable elements 202c are surrounded by the cavity 223. The movable elements 202c are free to move, compared with the movable elements 202c at the stage shown in FIG. 2N.

Figure 2P:
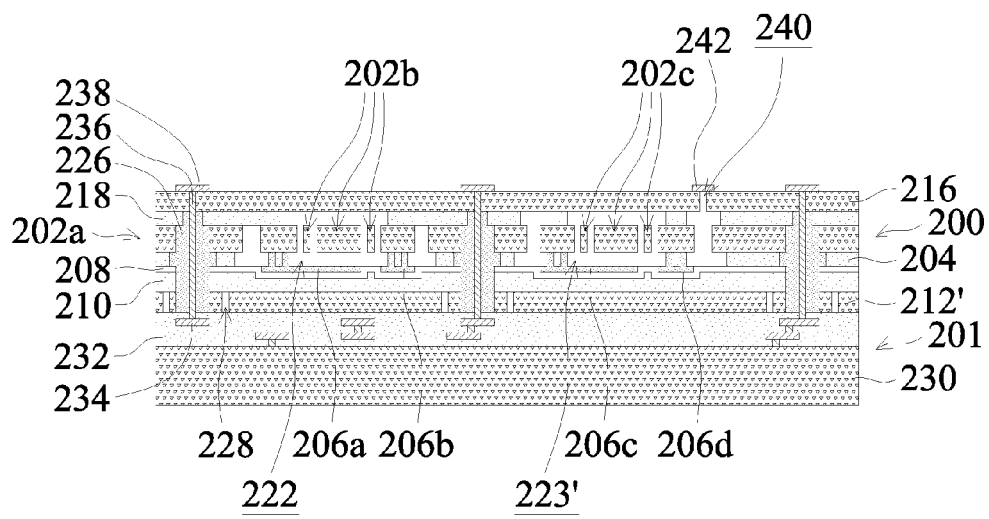
Figure 2Q:
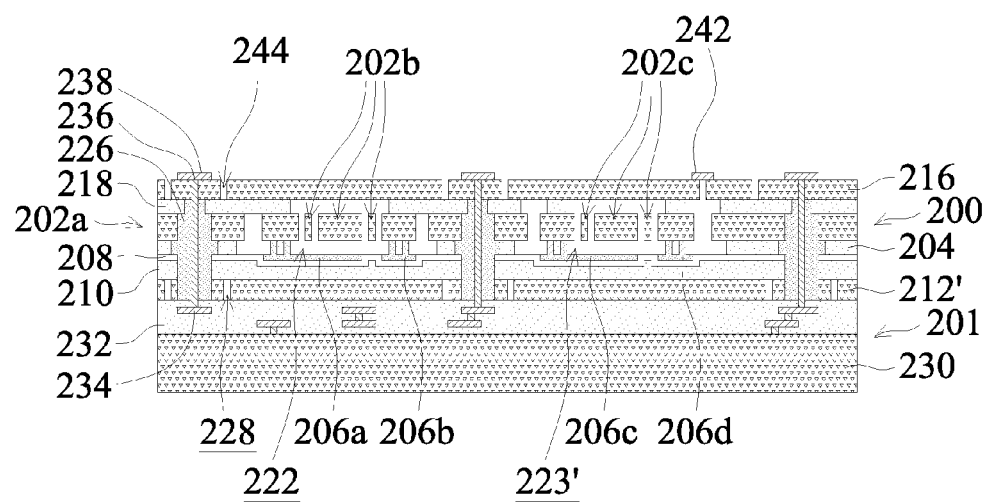

As shown in FIG. 2P, the cavities 223 is vacuumized and sealed by a sealing element 242 to form a closed chamber 223', in accordance with some embodiments. The sealing element 242 may be made of a metal material, dielectric material, semiconductor material, other applicable materials, or combinations thereof. In some embodiments, a sealing layer is deposited over the cap substrate 216 and patterned to be the sealing element 242. The sealing layer is deposited by using a PVD process, CVD process, other applicable processes, or combinations thereof. In some embodiments, a portion of the sealing layer is deposited over the etch stop layer 208 below the release hole 240. In some embodiments, a metal material is deposited on the etch stop layer 208, and the metal material is aligned with the release hole 240. An upper portion of the sidewall of the release hole 240 may also be covered by the metal material.

In some embodiments, the structure shown in FIG. 2O is disposed into a deposition tool to deposit the sealing layer.

The deposition tool may be a PVD deposition tool, such as a sputtering tool. The structure shown in FIG. 2I is disposed into a vacuumized process chamber of the deposition tool. After the deposition and patterning of the sealing element 242 as shown in FIG. 2P, a closed chamber 223' sealed by the sealing element 242 is formed. The closed chamber 223' may have a pressure in a range from about $10^{-7}$ torr to about 1.0 torr. In some embodiments, the pressures of the closed chambers 223' and 222 are different from each other. The pressure of the closed chamber 223' is lower than that of the closed chamber 222. A ratio of the pressure of the closed chamber 223' to the pressure of the closed chamber 222 may be in a range from about $10^{-11}$ to about 0.03.

In some embodiments, the sealing element 242 and the conductive pads 238 are formed simultaneously. That is, the conductive pads 238 are not limited to be formed during the stage shown in FIG. 2N. In some embodiments, a metal layer is deposited over the cap substrate 216 and patterned to be the sealing element 242 and the conductive pads 238 as shown in FIG. 2P. In these cases, the sealing element 242 and the conductive pads 238 are made of the same material.

As shown in FIG. 2Q, the cap substrate 216 is patterned to form openings 244 to separate the cap substrate 216 into a number of isolated elements, in accordance with some embodiments. A photolithography process and an etching process may be performed to partially remove the cap substrate 216 and pattern the cap substrate 216 for isolation. The structure shown in FIG. 2Q may also be diced to form multiple MEMS devices separated from each other.

As shown in FIG. 2Q, the blocking layer 212' and the second blocking layer 226 are formed between the closed chambers (including the closed chambers 222 and 223') and the dielectric layer 232 of the CMOS substrate 201. The second blocking layer 226 and the etch stop layer 208 surrounds the closed chambers to prevent gas from entering the closed chambers. Therefore, any gas coming from the dielectric layer 232 is blocked from entering the closed chambers 222 and 223'. The degrees of vacuum of the closed chambers 222 and 223' are maintained.

In some embodiments, the blocking layer 212' and the second blocking layer 226 are made of different materials. For example, the blocking layer 212' is made of single crystal silicon, and the second blocking layer 226 is made of polysilicon.

The dielectric layers 204, 210, and 218 have been annealed at the high temperature. Therefore, there is almost no gas, coming from the dielectric layers 204, 210, and 218, would enter the closed chambers 222 and 223'. As shown in FIG. 2Q, the etch stop layer 208 may also function as a blocking layer to maintain the degree of vacuum of the closed chambers 222 and 223'. Since the degree of vacuum is maintained, the performance of the MEMS device is greatly improved.

The MEMS device includes two or more closed chambers (222 and 223') with different pressures. Two or more MEMS elements with different functions are integrated in a single MEMS device. For example, the movable elements 202b in the closed chamber 222 are used for an accelerometer application, and the movable elements 202c in the closed chamber 223' are used for resonator and gyro applications. In some other embodiments, the movable elements, in different closed chambers with different degrees of vacuum, are used for other applications.

Figure 3A:
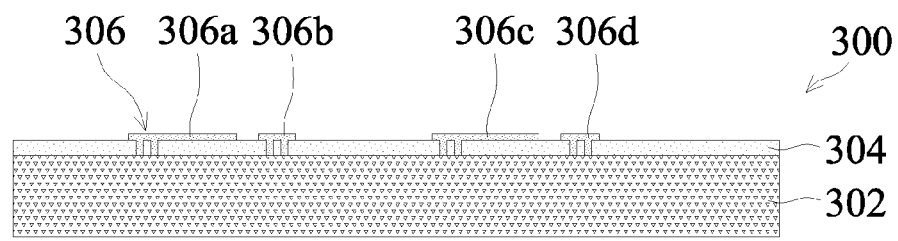
FIGS. 3A-3S are cross-sectional views of various stages of a process for forming a MEMS device, in accordance with some embodiments.

Embodiments of the disclosure have many variations. FIGS. 3A-3S are cross-sectional views of various stages of a process for forming a MEMS device, in accordance with some embodiments. Like reference numbers are used to designate like elements.

As shown in FIG. 3A, a MEMS substrate 300 (or a MEMS wafer) is provided, in accordance with some embodiments. The MEMS substrate 300 includes a semiconductor substrate 302. The semiconductor substrate 302 may be similar to the semiconductor substrate 202. As shown in FIG. 3A, a dielectric layer 304 is deposited over the semiconductor substrate 302. The material and the forming method of the dielectric layer 304 may be similar to those of the dielectric layer 204. The dielectric layer 304 is patterned to form one or more contact holes in the dielectric layer 304 to expose the semiconductor substrate 302.

As shown in FIG. 3A, a conductive layer 306 is deposited and patterned over the dielectric layer 304, in accordance with some embodiments. The material and the forming method of the conductive layer 306 may be similar to those of the conductive layer 206. The conductive layer 306 is patterned into multiple portions including portions 306a, 306b, 306c, and 306d, in accordance with some embodiments. Each of these portions may function as a contact element and/or an electrode element. Some of these portions may be electrically connected with each other.

Figure 3B:
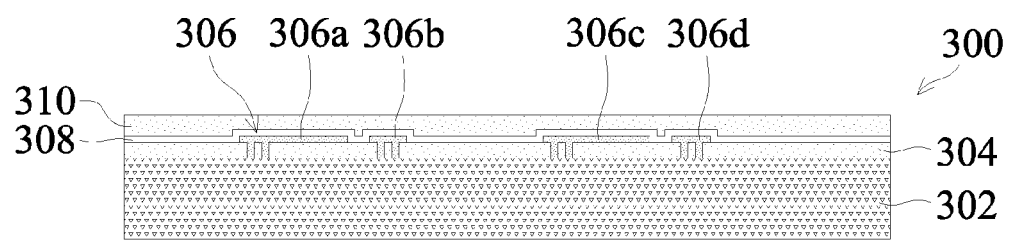

As shown in FIG. 3B, an etch stop layer 308 is deposited over the dielectric layer 304 and the conductive layer 306, in accordance with some embodiments. The etch stop layer 308 may be conformally deposited over the dielectric layer 304 and the conductive layer 306. The material and the forming method of the etch stop layer 308 may be similar to those of the etch stop layer 208. Afterwards, a dielectric layer 310 is deposited over the etch stop layer 308, as shown in FIG. 3B. The material and the forming method of the dielectric layer 310 may be similar to those of the dielectric layer 210.

Figure 3C:
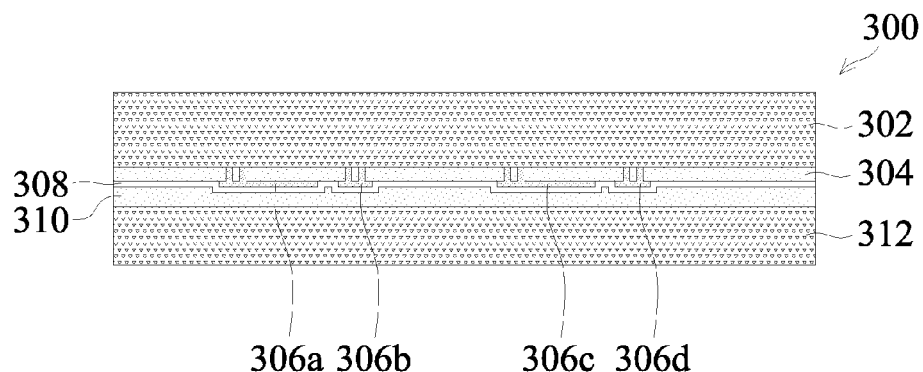

As shown in FIG. 3C, the MEMS substrate 300 is flipped upside down and bonded with a carrier substrate 312 (or a carrier wafer), in accordance with some embodiments. In subsequent operations, the carrier substrate 312 is thinned to be a blocking layer which is configured to block gas from penetrating through. The material of the carrier substrate 312 may be similar to that of the carrier substrate 212. The MEMS substrate 300 may be bonded with the carrier substrate 312 by using a method similar to that used for bonding the MEMS substrate 200 and the carrier substrate 212.

Figure 3D:
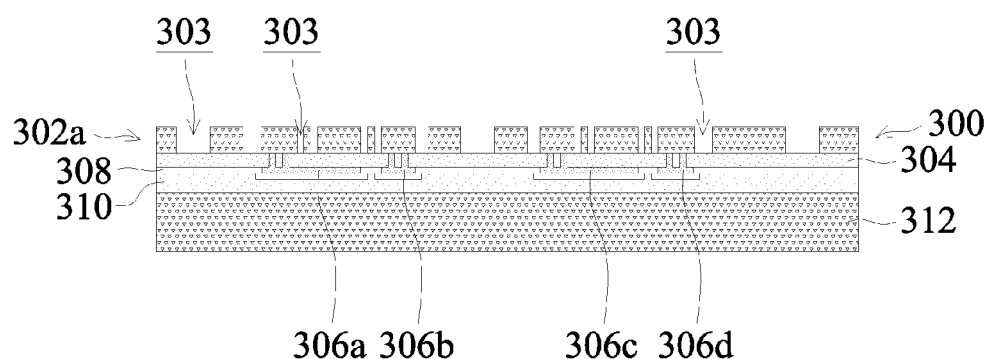

As shown in FIG. 3D, the semiconductor substrate 302 is thinned and patterned into a number of elements 302a, in accordance with some embodiments. The semiconductor substrate 302 may be thinned by using a mechanical grinding process, CMP process, etching process, other applicable processes, or combinations thereof. Afterwards, a portion of the thinned semiconductor substrate 302 is removed to form openings 303 which expose the dielectric layer 304. As a result, the thinned semiconductor substrate 302 is patterned to be the elements 302a. Some of the elements 302a connect with each other, and some of the elements do not connect with each other.

Figure 3E:
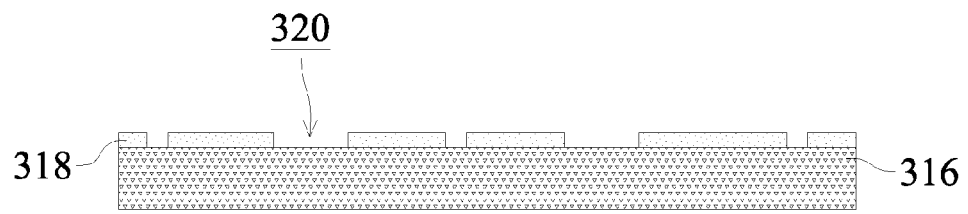

As shown in FIG. 3E, a cap substrate 316 (or cap wafer) and a patterned dielectric layer 318 formed over the cap substrate 316 are provided, in accordance with some embodiments. The materials of the cap substrate 316 and the dielectric layer 318 may be similar to those of the cap substrate 216 and the dielectric layer 218, respectively. The dielectric layer 318 is patterned to have a number of openings 320 which expose the cap substrate 316.

In some embodiments, the cap substrate 316 and the dielectric layer 318 are annealed at a high temperature to induce the outgassing of the dielectric layer 318. Therefore, the dielectric layer 318 contains less gas after being annealed. The degree of vacuum of a cavity or a closed chamber to be formed could be maintained more easily. For example, the cap substrate 316 and the dielectric layer 318 are annealed at a temperature ranging from about 900 degrees C. to about 1200 degrees C. for about 2 hours. Different annealing times may also be used. In some embodiments, the dielectric layer 318 is made of a thermal oxide or the like. In these cases, the annealing process may not be needed.

Figure 3F:
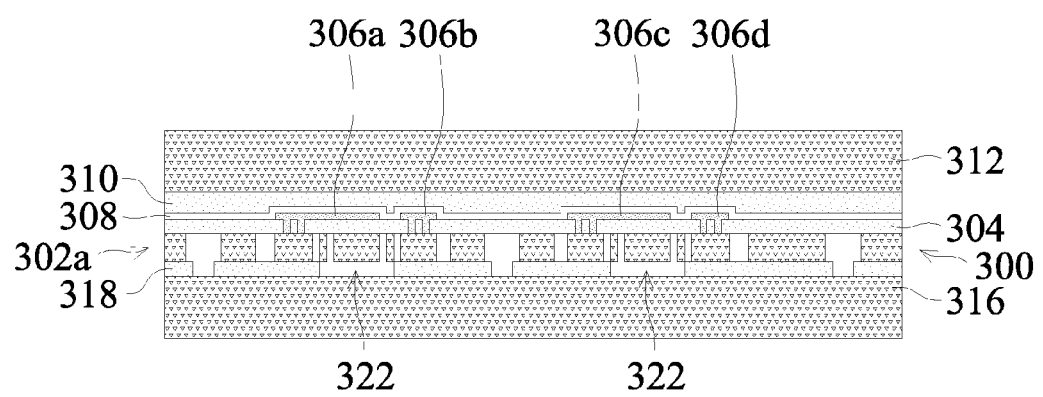

As shown in FIG. 3F, the structure shown in FIG. 3D is flipped upside down and bonded with the structure shown in FIG. 3E, in accordance with some embodiments. The elements 302a are bonded with the dielectric layer 318. The elements 302a may be in direct contact with the dielectric layer 318. The bonding between the elements 302a and the dielectric layer 318 may be achieved by using fusion bonding, eutectic bonding, plasma activated bonding, thermocompression bonding, diffusion bonding, anodic bonding, other applicable bonding, or combinations thereof.

As shown in FIG. 3F, a number of closed chambers 322 are formed between the cap substrate 316 and the carrier substrate 312 after the bonding between the elements 302a and the dielectric layer 318. Each of the closed chambers 322 is a combination of one of the openings 303 and one of the openings 320. The elements 302a are surrounded by the closed chambers 322. Some of the closed chambers 322 are connected to each other. Some of the closed chambers 322 are isolated from each other.

Figure 3G:
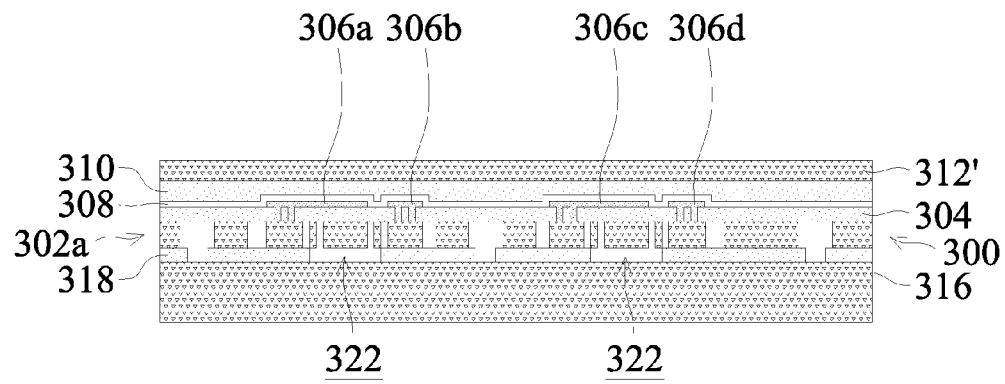

As shown in FIG. 3G, the carrier substrate 312 is thinned to be a blocking layer 312', in accordance with some embodiments. The blocking layer 312' is configured to block gas from penetrating through the blocking layer 312'. The blocking layer 312' may have a thickness in a range from about 2 μm to about 10 μm. In some other embodiments, the carrier substrate 312 is not thinned. In these cases, the carrier substrate 312 can also function as a blocking layer.

Figure 3H:
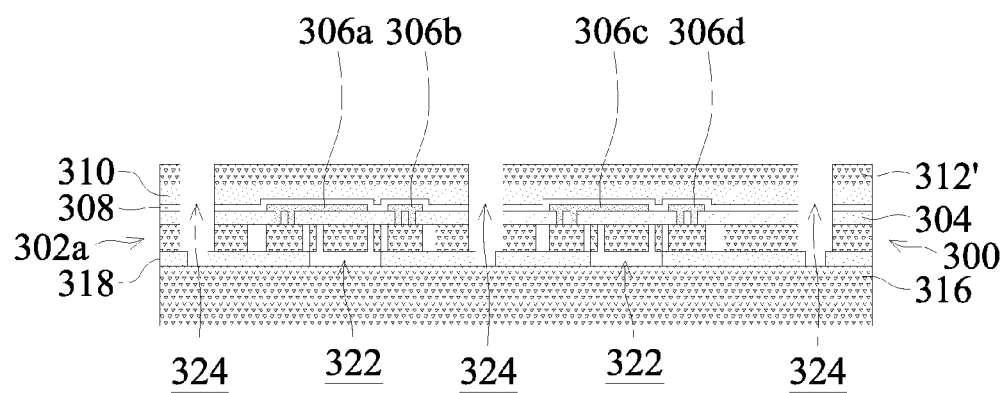

As shown in FIG. 3H, portions of the blocking layer 312', the dielectric layer 310, the etch stop layer 308, and the dielectric layer 304 are removed to form openings 324, in accordance with some embodiments. The openings 324 open some of the closed chambers 322 and expose the cap substrate 316. In some embodiments, a photolithography process and multiple etching processes are performed to form the openings 324. For example, a first etching process is performed to partially remove the blocking layer 312' to form through holes until the dielectric layer 310 is exposed. Afterwards, a second etching process is performed to partially remove the dielectric layer 310, the etch stop layer 308, and the dielectric layer 304. The dielectric layer 310, the etch stop layer 308, and the dielectric layer 304 may be etched in a single etching operation. For example, a suitable etchant, such as a mixture of $CF_4$ and $O_2$, may be used. As a result, the openings 324 are formed. Different etchants may be used in the first and second etching processes. An annealing process may then be performed at a temperature ranging from about 900 degrees C. to about 1200 degrees C. for about 2 hours. Different annealing times may also be used.

Figure 3I:
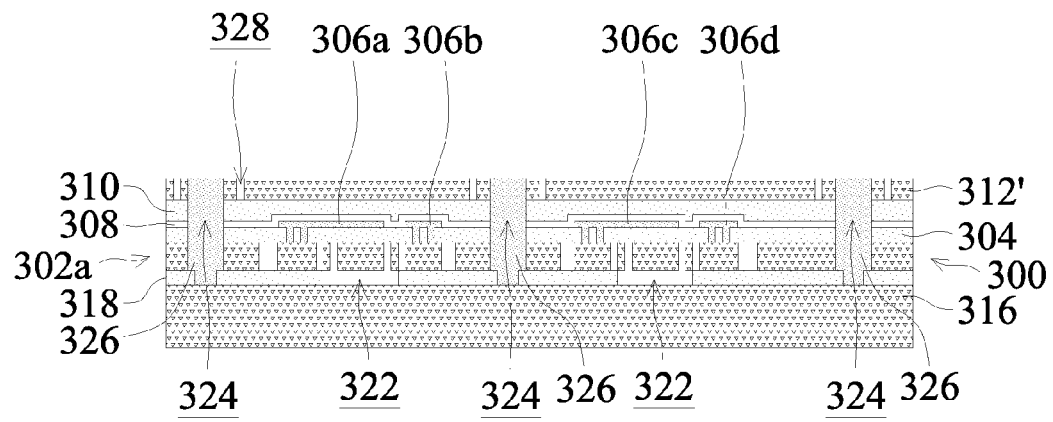

As shown in FIG. 3I, a second blocking layer 326 is deposited over the blocking layer 312' to fill the openings 324, in accordance with some embodiments. The second blocking layer 326 may be used to stop the gas coming from dielectric layers, such as those of a CMOS substrate (not shown in FIG. 3I) to be bonded with the MEMS substrate 300. The material and the forming method of the second blocking layer 326 may be similar to those of the second blocking layer 226.

If the blocking layer 312' and the second blocking layer 326 are electrically conductive, the blocking layer 312' may be patterned to form recesses 328 to separate the blocking layer 312' and the second blocking layer 326 into multiple isolated portions. Therefore, short circuiting is prevented. In some embodiments, each of the blocking layer 312' and the second blocking layer 326 also functions as an electrical shielding. Electromagnetic interference caused by neighboring elements, such as those of a CMOS substrate (not shown in FIG. 3I) to be bonded with the MEMS substrate 300, may be prevented by the blocking layer 312' and the second blocking layer 326.

Figure 3J:
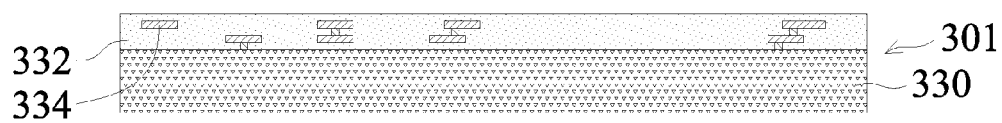

As shown in FIG. 3J, a CMOS substrate 301 (or a CMOS wafer) is provided, in accordance with some embodiments. The CMOS substrate 301 includes a semiconductor substrate 330 and a dielectric layer 332. The dielectric layer 332 includes multiple dielectric layers. Multiple conductive features (such as lines, vias, and contacts) are formed in the dielectric layer 332. The conductive features include conductive pads 334. Each of the conductive pads 334 is electrically connected to a region or a device element formed in/on the semiconductor substrate 330. In some embodiments, the dielectric layer 332 has a planarized top surface, which is, for example, a planarized oxide surface. The conductive pads 334 (or the top metal) may be buried under the planarized top surface.

Figure 3K:
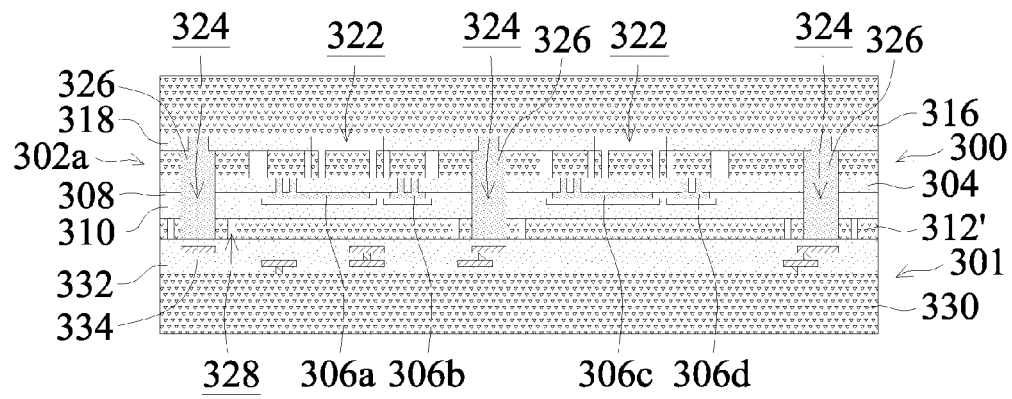

As shown in FIG. 3K, the MEMS substrate 300 and the CMOS substrate 301 are aligned and bonded with each other, in accordance with some embodiments. A fusion bonding process or other applicable processes may be performed to bond the planarized top surface of the dielectric layer 332 with the blocking layer 312' and the second blocking layer 326. In some embodiments, both the blocking layer 312' and the second blocking layer 326 are in direct contact with the dielectric layer 332. Some of the conductive pads 334 are substantially aligned with the second blocking layer 326 filling the openings 324.

Figure 3L:
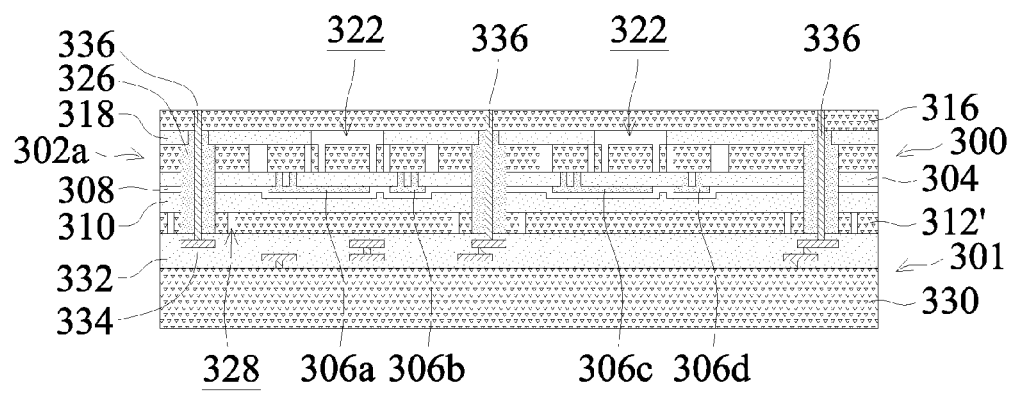

Afterwards, as shown in FIG. 3L, the cap substrate 316 is thinned, in accordance with some embodiments. The cap substrate 316 is thinned by using a suitable process. The suitable process may include a mechanical grinding process, CMP process, etching process, other applicable processes, or combinations thereof.

As shown in FIG. 3L, conductive plugs 336 are formed to electrically and respectively connect to the conductive pads 334, in accordance with some embodiments. Each of the conductive plugs 336 penetrates through the cap substrate 316, the second blocking layer 326, and the dielectric layer 332 to electrically contact with the corresponding one of the conductive pads 334. In some embodiments, the conductive plugs 336 are in direct contact with the second blocking layer 326. Each of the conductive plugs 336 may have a single width. The material and the forming method of the conductive plugs 336 may be similar to those of the conductive plugs 236.

Figure 3M:
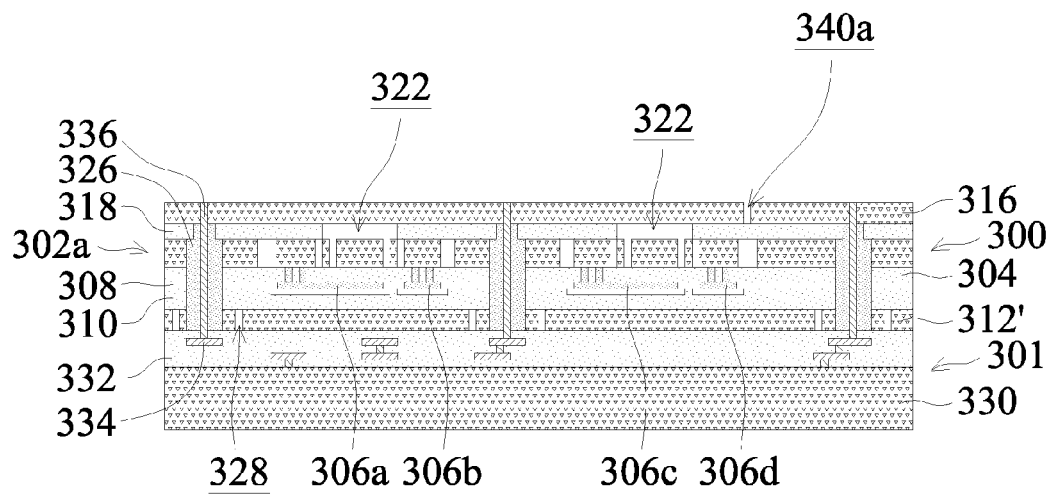

As shown in FIG. 3M, one or more release holes 340a are formed in the cap substrate 316 to expose the dielectric layer 318, in accordance with some embodiments. A photolithography process and an etching process may be performed to form the release hole(s) 340a. In some embodiments, a single release hole 340a is formed in the cap substrate 316.

Figure 3N:
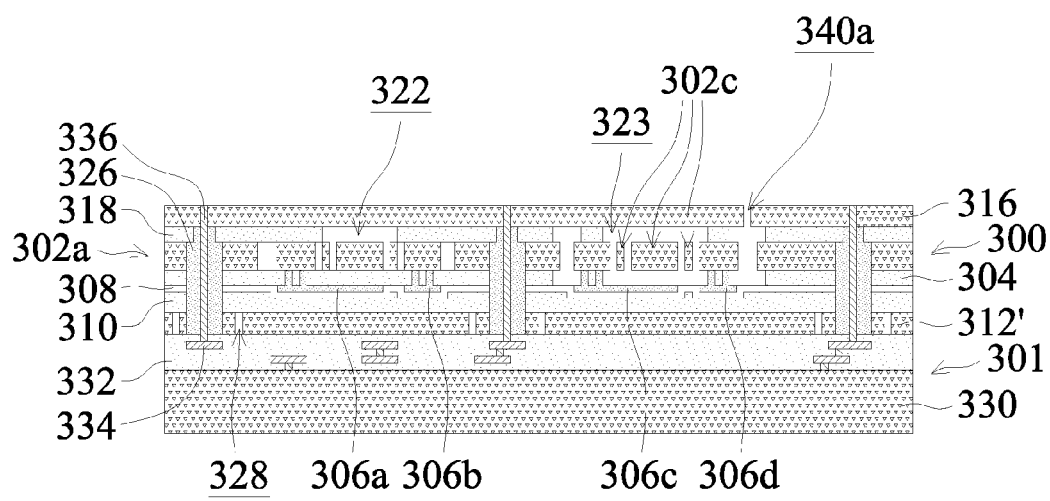

As shown in FIG. 3N, a portion of the dielectric layer 318 is removed through the release hole(s) 340a such that the closed chamber 322 is open to form a cavity 323, in accordance with some embodiments. An etching process is performed to form the cavity 323. As a result, some of the elements 302a are released from the dielectric layer 318 and become movable elements including movable elements 302c. A portion of the dielectric layer 318 originally surrounding the closed chamber 322 is now removed such that the movable elements 302c surrounded by the cavity 323 are free to move.

Figure 3O:
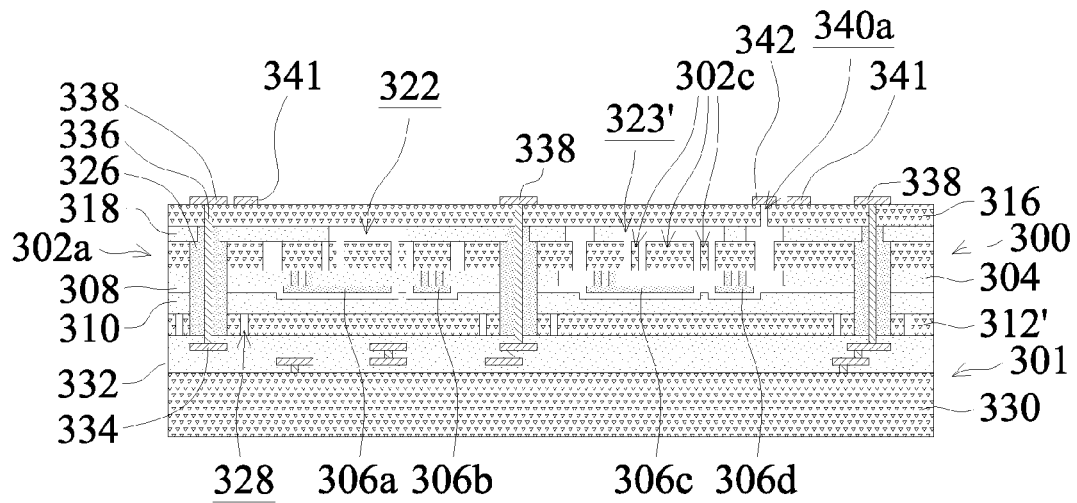

As shown in FIG. 3O, the cavity 323 is vacuumized and sealed by a sealing element 342 to form a closed chamber 323', in accordance with some embodiments. The material and the forming method of the sealing element 342 may be similar to those of the sealing element 242. In some embodiments, the structure shown in FIG. 3N is disposed into a deposition tool to deposit a sealing layer for forming the sealing element 342. The deposition tool may be a PVD deposition tool, such as a sputtering tool. The structure shown in FIG. 3N is disposed into a vacuumized process chamber of the deposition tool. After the deposition and patterning of the sealing element 342 as shown in FIG. 3O, a closed chamber 323' sealed by the sealing element 342 is formed. The closed chamber 323' may have a pressure in a range from about $10^{-7}$ torr to about 1.0 torr.

As shown in FIG. 3O, conductive pads 338 and bonding elements 341 are formed over the cap substrate 316, in accordance with some embodiments. The conductive pads 338 are electrically connected to the conductive plugs 336, respectively. The conductive pads 338 may be in direct contact with the conductive plugs 336, respectively. The bonding elements 341 are used for bonding with a second cap substrate which will be described later.

In some embodiments, the sealing element 342, the conductive pads 338, and the bonding elements 341 are formed simultaneously. In some embodiments, a metal layer is deposited over the cap substrate 316 and patterned to be the sealing element 342, the conductive pads 338, and the bonding elements 341 as shown in FIG. 3O. In these cases, the sealing element 342, the conductive pads 338, and the bonding elements 341 are made of the same material.

Figure 3P:
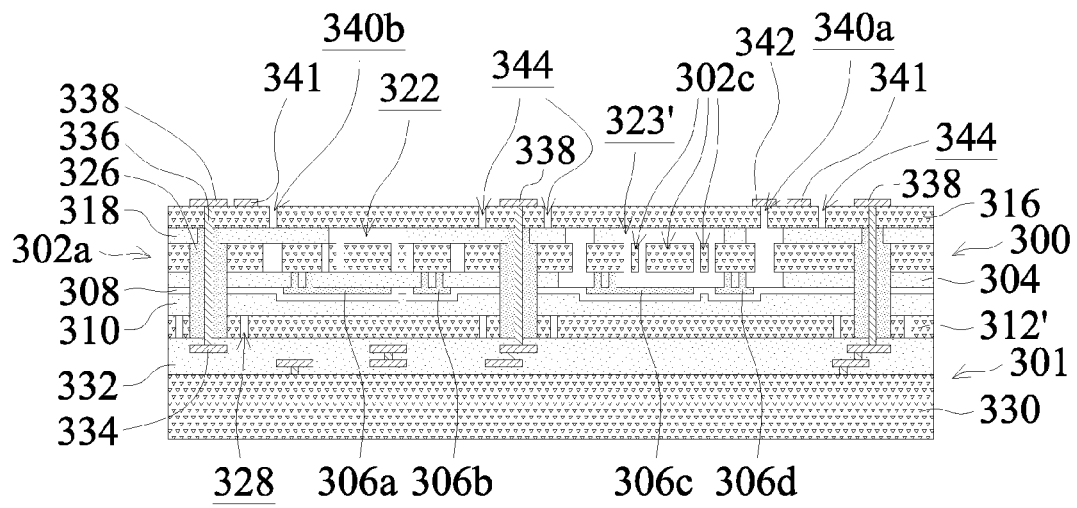

As shown in FIG. 3P, one or more release holes 340b are formed in the cap substrate 316 to expose the dielectric layer 318, in accordance with some embodiments. Openings 344 may also be formed in the cap substrate 316 to separate the cap substrate 316 into a number of isolated elements to prevent short circuiting. In some embodiments, the release hole(s) 340b and the openings 344 are formed simultaneously. A photolithography process and an etching process may be performed to form the release hole(s) 340b and the openings 344. In some embodiments, a single release hole 340a is formed in the cap substrate 316.

Figure 3Q:
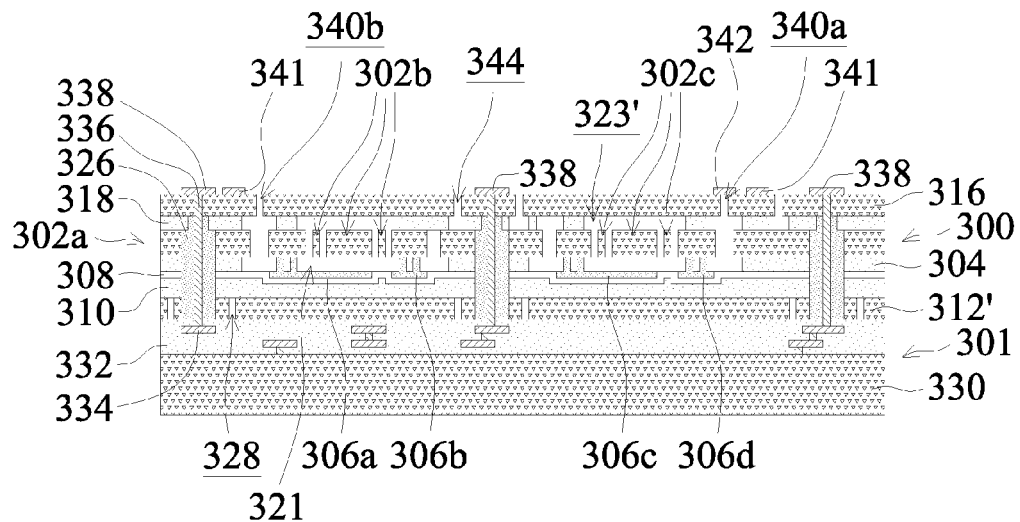

As shown in FIG. 3Q, a portion of the dielectric layer 318 is removed through the release hole(s) 340b such that the closed chamber 322 is open to be a cavity 321, in accordance with some embodiments. A portion of the dielectric layer 318 under the openings 344 is also removed. An etching process is performed to form the cavity 322. As a result, some of the elements 302a are released from the dielectric layer 318 and become movable elements including movable elements 302b. A portion of the dielectric layer 318 originally surrounding the closed chamber 322 is now removed such that the movable elements 302b surrounded by the cavity 321 are free to move.

Figure 3R:
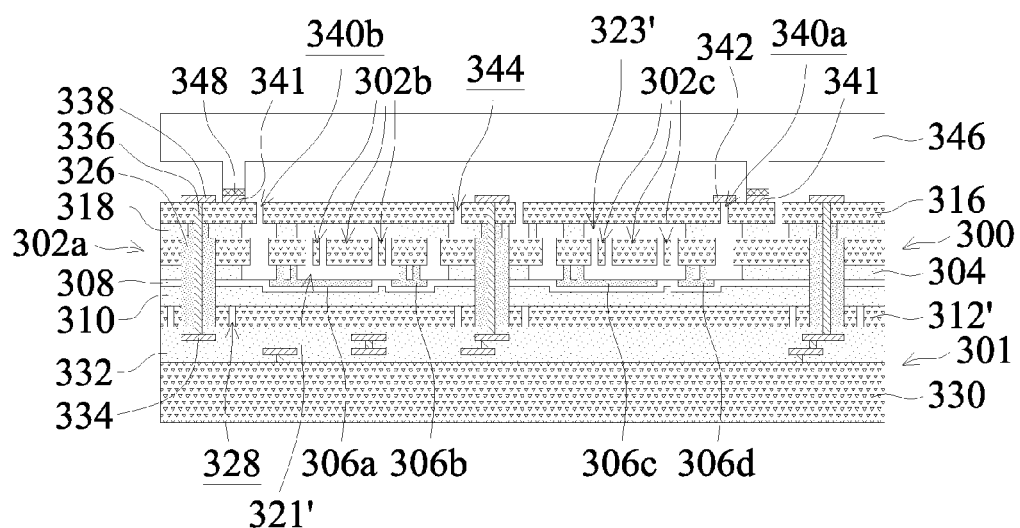
Figure 3S:
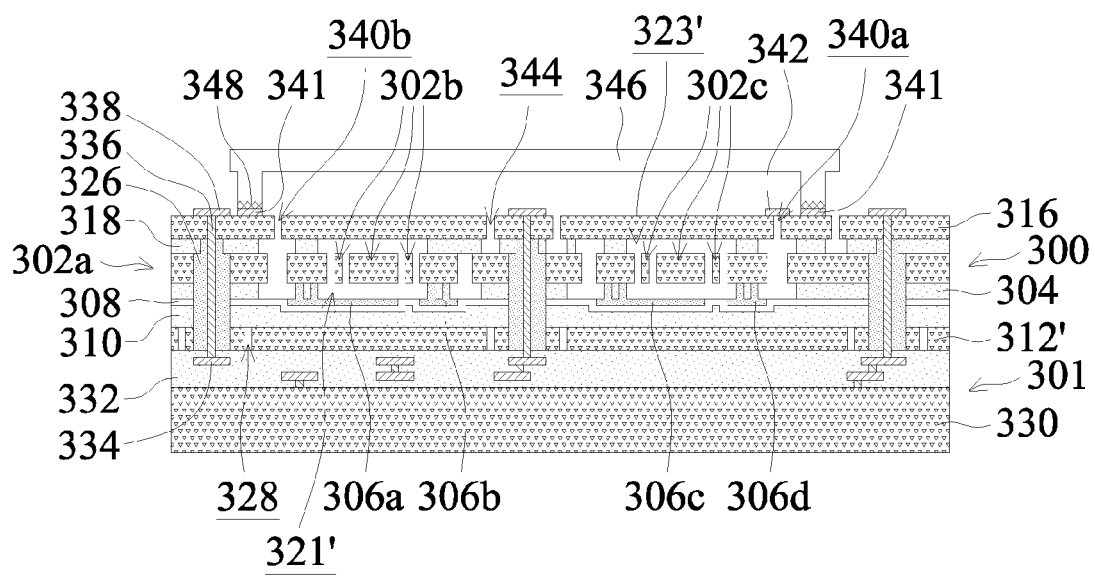

As shown in FIG. 3R, a second cap substrate 346 is bonded with the cap substrate 316 to close and/or seal the cavity 321 and form a closed chamber 321', in accordance with some embodiments. The second closed chambers 321' is between the second cap substrate 346 and the MEMS substrate 300. As shown in FIG. 3R, the closed chamber 321' is surrounded by the second cap substrate 346, the cap substrate 316, and the MEMS substrate 300. A portion of the closed chamber 321' between the cap substrates 316 and 346 is overlying the closed chamber 323'.

The second cap substrate 346 may be a semiconductor substrate or other suitable substrate, such as a glass substrate. The second cap substrate 346 may be bonded with the cap substrate 316 by using an applicable bonding process, such as a eutectic bonding process. Bonding elements 348 are formed over the second cap substrate 346 and are used to be bonded with the bonding elements 341 previously formed over the cap substrate 316. In some embodiments, the bonding elements 348 are made of a semiconductor material such as germanium or the like, and the bonding elements 341 are made of a metal material such as aluminum or the like.

The bonding process may be performed in a process chamber, which has a predetermined pressure, of a bonding tool. As a result, the closed chambers 321' formed in the process chamber would also have substantially the same pressure. In some embodiments, the pressure of each of the closed chambers 321' is in a range from about 0.05 atm to about 3 atm. The pressure of the closed chambers 321' may be adjusted by tuning the pressure of the process chamber.

In some embodiments, the pressures of the closed chambers 323' and 321' are different from each other. The pressure of the closed chamber 323' is lower than that of the closed chamber 321'. A ratio of the pressure of the closed chamber 323' to the pressure of the closed chamber 321' may be in a range from about $10^{-11}$ to about 0.03.

As shown in FIG. 3S, the second cap substrate 346 is thinned and patterned such that some of the conductive pads 338 are exposed, in accordance with some embodiments. The second cap substrate 346 may be thinned before being patterned. The second cap substrate 346 may be patterned by using a dicing saw. The structure shown in FIG. 3S may also be diced to form multiple MEMS devices separated from each other.

As shown in FIG. 3S, the blocking layer 312' and the second blocking layer 326 are formed between the closed chambers (including the closed chambers 321' and 323') and the dielectric layer 332 of the CMOS substrate 301. The second blocking layer 326 and the etch stop layer 308 surrounds the closed chambers to prevent gas from entering the closed chambers. Therefore, any gas coming from the dielectric layer 332 is blocked from entering the closed chambers 321' and 323'. The degrees of vacuum of the closed chambers 321' and 323' are maintained.

The dielectric layers 304, 310, and 318 have been annealed at the high temperature. Therefore, there is almost no gas, coming from the dielectric layers 304, 310, and 318, would enter the closed chambers 321' and 323'. As shown in FIG. 3S, the etch stop layer 308 may also function as a blocking layer to maintain the degree of vacuum of the closed chambers 321' and 323'. Since the degree of vacuum is maintained, the performance of the MEMS device is greatly improved.

The MEMS device includes two or more closed chambers (321' and 223') with different pressures. Two or more MEMS elements with different functions are integrated in a single MEMS device. For example, the movable elements 302b in the closed chamber 321' are used for an accelerometer application, and the movable elements 302c in the closed chamber 323' are used for resonator and gyro applications. In some other embodiments, the movable elements, in different closed chambers with different degrees of vacuum, are used for other applications.

Embodiments of mechanisms for forming a MEMS device described above form two or more closed chambers with different degrees of vacuum. Two or more MEMS elements with different functions are therefore integrated in the same MEMS device. Multiple blocking layers are between dielectric layers of a CMOS substrate and the closed chambers. An etch stop layer, such as a low stress nitride layer, could also be used to block gas outside of the closed chambers. Before bonding with the CMOS substrate, a MEMS substrate is annealed at a high temperature to reduce gas coming from dielectric layers of the MEMS substrate. Therefore, the degrees of vacuum of the closed chambers are appropriately maintained. The performance and functions of the MEMS device are significantly improved.

In accordance with some embodiments, a MEMS device is provided. The MEMS device includes a CMOS substrate, a cap substrate, and a MEMS substrate bonded between the CMOS substrate and the cap substrate. The MEMS substrate includes a first movable element and a second movable element. The MEMS device also includes a first closed chamber and a second closed chamber, which are between the MEMS substrate and the cap substrate. The first movable element is in the first closed chamber, and the second movable element is in the second closed chamber. A first pressure of the first closed chamber is higher than a second pressure of the second closed chamber.

In accordance with some embodiments, a MEMS device is provided. The MEMS device includes a CMOS substrate, a first cap substrate, and a second cap substrate bonded with the first cap substrate. The MEMS device also includes a MEMS substrate bonded between the CMOS substrate and the first cap substrate. The MEMS substrate includes a first movable element and a second movable element, and the first cap substrate is between the second cap substrate and the MEMS substrate. The MEMS device further includes a first closed chamber between the MEMS substrate and the second cap substrate, and the first movable element is in the first closed chamber. In addition, the MEMS device includes a second closed chamber between the MEMS substrate and the first cap substrate, and the second movable element is in the second closed chamber. A first pressure of the first closed chamber is higher than a second pressure of the second closed chamber.

In accordance with some embodiments, a method for forming a MEMS device is provided. The method includes forming a dielectric layer over a semiconductor substrate and bonding the dielectric layer with a carrier substrate. The method also includes patterning the semiconductor substrate into a plurality of elements and partially removing the dielectric layer to release some of the elements. The released elements become a first movable element and a second movable element. The method further includes bonding a cap substrate with the semiconductor substrate to form a first closed chamber and a second closed chamber between the semiconductor substrate and the cap substrate. In addition, the method includes bonding a CMOS substrate with the carrier substrate and removing a portion of the cap substrate to open the second closed chamber. The method also includes vacuumizing and sealing the second closed chamber such that the second closed chamber has a second pressure after the second closed chamber is open. A first pressure of the first closed chamber is higher than the second pressure, and the first movable element and the second movable element are in the first closed chamber and the second closed chamber, respectively.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro mechanical system (MEMS) device, comprising:
    a CMOS substrate;
    a cap substrate;
    a MEMS substrate bonded between the CMOS substrate and the cap substrate, wherein the MEMS substrate comprises at least one first movable element and at least one second movable element;
    a first closed chamber between the MEMS substrate and the cap substrate, wherein the first movable element is in the first closed chamber; and
    a second closed chamber between the MEMS substrate and the cap substrate, wherein the second movable element is in the second closed chamber, and a first pressure of the first closed chamber is higher than a second pressure of the second closed chamber; and
    a surrounding blocking layer surrounding the first and second closed chambers, wherein the surrounding blocking layer extends towards the CMOS substrate and the cap substrate and surrounds sidewalls of the first closed chamber and the second closed chamber, and the surrounding blocking layer is configured to block gas, coming from the CMOS substrate, from entering the first and second closed chambers.

2. The MEMS device as claimed in claim 1, further comprising a blocking layer between the CMOS substrate and the first and second closed chambers, wherein the blocking layer is configured to block gas, coming from the CMOS substrate, from entering the first and second closed chambers.

3. The MEMS device as claimed in claim 1, wherein the surrounding blocking layer comprises polysilicon.

4. The MEMS device as claimed in claim 2, wherein the blocking layer comprises single crystal silicon.

5. The MEMS device as claimed in claim 1, further comprising a conductive plug penetrating through the surrounding blocking layer and electrically connected to a conductive pad of the CMOS substrate.

6. The MEMS device as claimed in claim 1, further comprising an etch stop layer surrounding the first closed chamber and the second closed chamber.

7. The MEMS device as claimed in claim 6, wherein the etch stop layer comprises silicon nitride, and the etch stop layer has a stress in a range from about −50 MPa to about 50 MPa.

8. The MEMS device as claimed in claim 1, wherein a ratio of the second pressure to the first pressure is in a range from about $10^{-11}$ to about 0.03.

9. The MEMS device as claimed in claim 1, wherein functions of the first movable element and the second movable element are different from each other.

10. The MEMS device as claimed in claim 1, further comprising:
   a hole penetrating through the cap substrate; and
   a sealing element over the cap substrate, wherein the sealing element covers the hole, and the sealing element is configured to seal the second closed chamber, and the sealing element comprises a metal material.

11. A micro-electro mechanical system (MEMS) device, comprising:
   a CMOS substrate;
   a first cap substrate;
   a second cap substrate bonded with the first cap substrate;
   a MEMS substrate bonded between the CMOS substrate and the first cap substrate, wherein the MEMS substrate comprises at least one first movable element and at least one second movable element, and the first cap substrate is between the second cap substrate and the MEMS substrate;
   a first closed chamber between the MEMS substrate and the second cap substrate, wherein the first movable element is in the first closed chamber; and
   a second closed chamber between the MEMS substrate and the first cap substrate, wherein the second movable element is in the second closed chamber, and a first pressure of the first closed chamber is higher than a second pressure of the second closed chamber; and
   a surrounding blocking layer surrounding the first and second closed chambers, wherein the surrounding blocking layer is configured to block gas, coming from the CMOS substrate, from entering the first and second closed chambers.

12. The MEMS device as claimed in claim 11, wherein a portion of the first closed chamber is between the first cap substrate and the second cap substrate and overlying the second closed chamber.

13. The MEMS device as claimed in claim 11, wherein a ratio of the second pressure to the first pressure is in a range from about $10^{-11}$ to about 0.03.

14. The MEMS device as claimed in claim 11, further comprising a blocking layer between the CMOS substrate and the first and second closed chambers, wherein the blocking layer is configured to block gas, coming from the CMOS substrate, from entering the first and second closed chambers.

15. The MEMS device as claimed in claim 11, further comprising an etch stop layer surrounding the first closed chamber and the second closed chamber, wherein the etch stop layer comprises silicon nitride, and has a stress in a range from about −50 MPa to about 50 MPa.

16. The MEMS device as claimed in claim 11, wherein the surrounding blocking layer comprises polysilicon.

17. The MEMS device as claimed in claim 14, wherein the blocking layer comprises single crystal silicon.

18. The MEMS device as claimed in claim 11, further comprising a conductive plug penetrating through the surrounding blocking layer and electrically connected to a conductive pad of the CMOS substrate.

19. The MEMS device as claimed in claim 11, wherein functions of the first movable element and the second movable element are different from each other.

20. The MEMS device as claimed in claim 11, further comprising;
   a hole penetrating through the first cap substrate; and
   a sealing element over the first cap substrate, wherein the sealing element covers the hole, and the sealing element is configured to seal the second closed chamber.

* * * * *